US012613279B2

(12) United States Patent
Tsai et al.

(10) Patent No.: US 12,613,279 B2
(45) Date of Patent: Apr. 28, 2026

(54) BATTERY CAPACITY ESTIMATION METHOD, AND BATTERY MODULE AND ELECTRONIC PRODUCT USING THE SAME

(71) Applicant: SIMPLO TECHNOLOGY CO., LTD., Hsinchu County (TW)

(72) Inventors: Ching-Hung Tsai, Hsinchu County (TW); Kuo-Liang Teng, Hsinchu County (TW)

(73) Assignee: SIMPLO TECHNOLOGY CO., LTD., Hsinchu County (TW)

( * ) Notice: Subject to any disclaimer, the term of this patent is extended or adjusted under 35 U.S.C. 154(b) by 441 days.

(21) Appl. No.: 18/185,004

(22) Filed: Mar. 16, 2023

(65) Prior Publication Data

US 2023/0408587 A1 Dec. 21, 2023

(30) Foreign Application Priority Data

Jun. 15, 2022 (TW) ................................. 111122114

(51) Int. Cl.
| | |
|---|---|
| *G01R 31/382* | (2019.01) |
| *G01R 31/36* | (2020.01) |
| *G01R 31/392* | (2019.01) |
| *G01R 31/396* | (2019.01) |
| *H01M 10/48* | (2006.01) |

(52) U.S. Cl.
CPC ....... *G01R 31/382* (2019.01); *G01R 31/3648* (2013.01); *G01R 31/392* (2019.01); *G01R 31/396* (2019.01); *H01M 10/486* (2013.01)

(58) Field of Classification Search
CPC .. G01R 31/382; G01R 31/392; G01R 31/396; H01M 10/486

USPC ........................................................... 702/63
See application file for complete search history.

(56) References Cited

U.S. PATENT DOCUMENTS

| | | | | |
|---|---|---|---|---|
| 2013/0066573 A1* | 3/2013 | Bond | ................... | G01R 31/392 |
| | | | | 324/426 |
| 2014/0129163 A1* | 5/2014 | Betzner | ................ | G01R 31/367 |
| | | | | 702/63 |
| 2022/0214403 A1* | 7/2022 | Guo | ...................... | H02J 7/0048 |
| 2023/0039331 A1* | 2/2023 | Shim | ................... | G01R 31/382 |

(Continued)

FOREIGN PATENT DOCUMENTS

| | | | | | |
|---|---|---|---|---|---|
| CN | 110386003 A | * | 10/2019 | ............. | B60K 6/485 |
| KR | 101268082 B1 | * | 6/2013 | ........... | G01R 31/389 |
| TW | 201314236 A | | 4/2013 | | |

(Continued)

OTHER PUBLICATIONS

English translation of CN110386003. Oct. 29, 2019. (Year: 2019).*

(Continued)

*Primary Examiner* — Michael P Nghiem
(74) *Attorney, Agent, or Firm* — MUNCY, GEISSLER, OLDS & LOWE, P.C.

(57) ABSTRACT

A battery capacity estimation method, and a battery module and an electronic product using the same are disclosed. In the battery capacity estimation method, after a control system of the battery module has judged that a battery has been charged to a fully charged state for a predetermined period and entered a rest state, a detection unit of the control system measures an open circuit voltage and a temperature of the battery, according to which a full charge capacity of the battery is calculated.

12 Claims, 11 Drawing Sheets

(56) References Cited

U.S. PATENT DOCUMENTS

2024/0418791 A1 * 12/2024 Pilatowicz ........... G01R 31/392

FOREIGN PATENT DOCUMENTS

| | | | |
|---|---|---|---|
| TW | I613455 | B | 2/2018 |
| TW | 202022645 | A | 6/2020 |
| TW | I711832 | B | 12/2020 |
| TW | 202201034 | A | 1/2022 |
| TW | I753734 | B | 1/2022 |

OTHER PUBLICATIONS

EP 21201655.4, priority document of U.S. Pat. No. 20240418791, Oct. 8, 2021. (Year: 2021).*

English translation of KR-101268082, Jun. 4, 2013. (Year: 2013).*

* cited by examiner

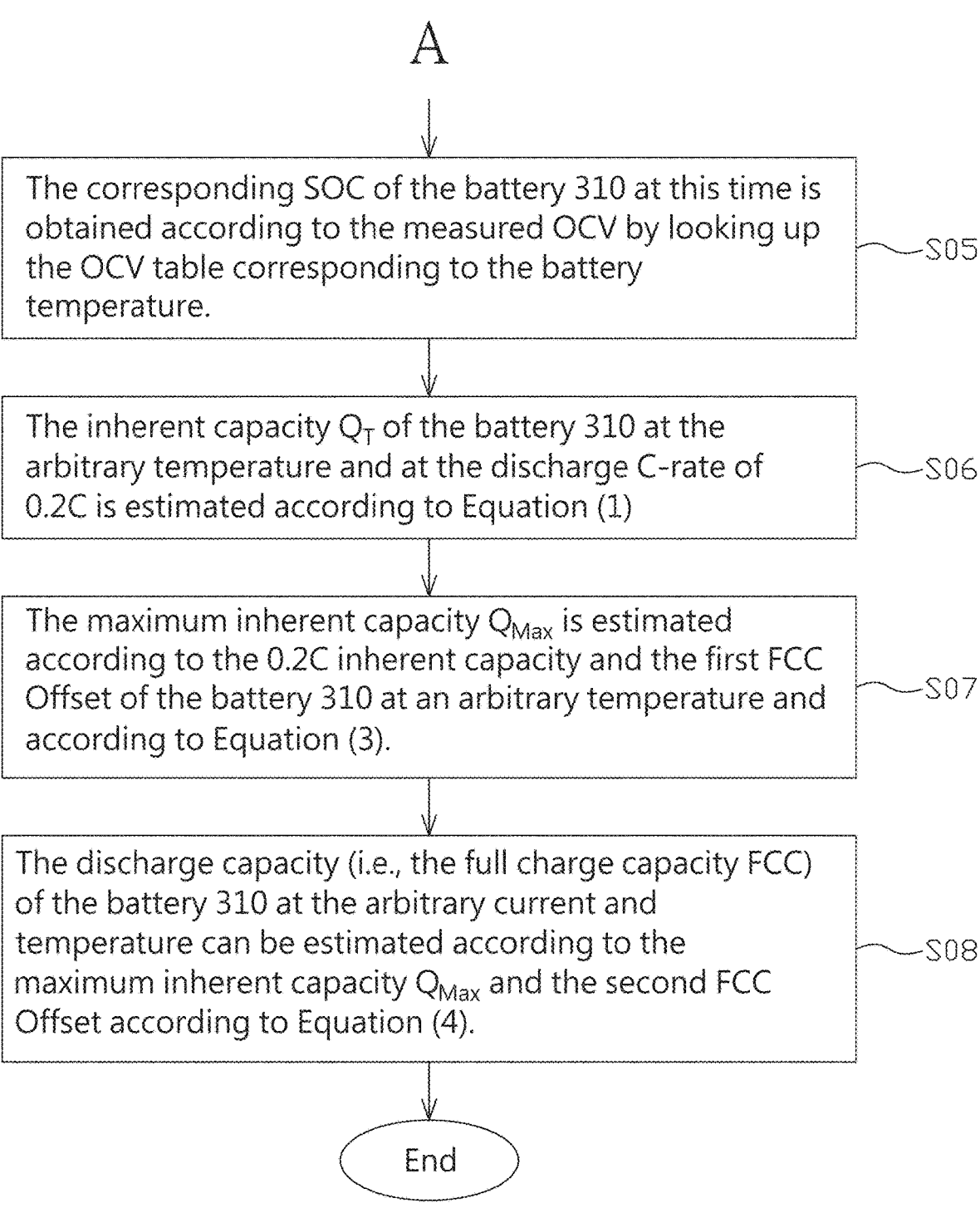

A

The corresponding SOC of the battery 310 at this time is obtained according to the measured OCV by looking up the OCV table corresponding to the battery temperature. —S05

The inherent capacity $Q_T$ of the battery 310 at the arbitrary temperature and at the discharge C-rate of 0.2C is estimated according to Equation (1) —S06

The maximum inherent capacity $Q_{Max}$ is estimated according to the 0.2C inherent capacity and the first FCC Offset of the battery 310 at an arbitrary temperature and according to Equation (3). —S07

The discharge capacity (i.e., the full charge capacity FCC) of the battery 310 at the arbitrary current and temperature can be estimated according to the maximum inherent capacity $Q_{Max}$ and the second FCC Offset according to Equation (4). —S08

End

FIG. 7B

BATTERY CAPACITY ESTIMATION METHOD, AND BATTERY MODULE AND ELECTRONIC PRODUCT USING THE SAME

CROSS-REFERENCE TO RELATED APPLICATIONS

This application claims priority of No. 111122114 filed in Taiwan on 2022/6/15 under 35 USC 119, the entire content of which is hereby incorporated by reference.

BACKGROUND OF THE INVENTION

Field of the Invention

This disclosure relates to a battery capacity estimation method, and a battery module and an electronic product using the same, and particularly, to a battery capacity estimation method for measuring an open circuit voltage and a temperature of a battery after the battery has been charged to a fully charged state for a predetermined period, and then calculating a full charge capacity according to the open circuit voltage and the temperature, and a battery module and electronic product using such the method.

Description of the Related Art

Lithium-ion batteries have been widely used in many 3C (computer, communication, and consumer electronics) products, each of which usually reports a remaining percentage (%) of the state of charge (SOC) of a battery to an end user, so that the end user can substantially obtain the remaining percentage of the battery, and prepare for countermeasures in advance. The algorithm of the SOC is to calculate the percentage representative of a ratio of a remaining capacity (RC) of the battery to a full charge capacity (FCC or fully charged capacity). It can be obtained that the FCC is an important key of determining the accuracy of the SOC.

Most battery capacity algorithms on the market update the FCC according to a look-up table. In such the algorithms, the voltage (typically 9 or 6%) of the remaining percentage of the pre-created absolute SOC substantially functions as the mandatory correction point of voltage. When the battery is continuously discharged from a fully charged state to the state which the voltage of the battery is lower than the forced voltage correction point, the SOC is corrected to the corresponding remaining percentage in a forced manner, and meanwhile the FCC is updated.

According to the use habit of the normal end users, such the method encounters two difficulties and the FCC is not updated for a long time. The first difficulty is that the end users would not use the battery from deep discharging to the mandatory correction point of voltage. The second difficult is that the continuous discharge condition needs to be satisfied before the battery is discharged from the fully charged state to the forced voltage correction point. If the end users need to charge the battery before the battery is discharged to the forced voltage correction point, then the FCC cannot be updated. Therefore, a novel method of estimating the FCC is required to improve the displayed remaining percentage of the battery level.

BRIEF SUMMARY OF THE INVENTION

According to an embodiment of this disclosure, a battery capacity estimation method capable of updating a full charge capacity (FCC) is provided even if a continuous discharge condition is not reached. In one embodiment, an open circuit voltage (OCV) of a battery in a rest state is measured after the battery has been continuously electrically connected to a power source for a predetermined period, and then at least one FCC of the battery is calculated according to the OCV.

According to an embodiment of this disclosure, a battery capacity estimation method applied to a battery module including a battery and a control system is provided to detect the battery of the battery module. The control system includes a detection unit, a storage unit and a processing unit. The storage unit stores open circuit voltage information (OCV information) and multiple design capacities. The OCV information includes an open circuit voltage table (OCV table) or a function corresponding to different temperatures. The battery capacity estimation method includes steps of: measuring, by the detection unit, an OCV and a temperature of the battery when the processing unit knows that the battery has been charged to a fully charged state for a predetermined period and entered a rest state; obtaining, by the processing unit, a SOC of the battery according to both of the OCV of the battery and the OCV table or the function at the temperature of the battery; obtaining a design capacity corresponding to the temperature according to the multiple design capacities and the temperature; and calculating, by the processing unit, a $Q_T$ of the battery according to the design capacity corresponding to the temperature and the SOC, wherein the $Q_T$ represents an inherent capacity at the temperature.

In one embodiment, the design capacities are preferably multiple battery capacities changing with different temperatures at a predetermined discharge C-rate, and the $Q_T$ is preferably a battery capacity at the temperature and the predetermined discharge C-rate.

In one embodiment, the inherent capacity is calculated according to Equation 1:

Equation 1: $Q_T$=Design Capacity$_T$×SOC %, wherein T represents the temperature, Design Capacity$_T$ represents the design capacity corresponding to the temperature and a predetermined discharge C-rate, and SOC represents the state of charge.

In one embodiment, the SOC plus a depth of discharge (DOD) equals 100%, and the $Q_T$ is calculated according to Equation 2:

Equation 2: $Q_T$=Design Capacity$_T$×(1−DOD %), wherein T represents the temperature, Design Capacity$_T$ represents the design capacity corresponding to the temperature and a predetermined discharge C-rate, and DOD represents the depth of discharge. In one embodiment, a state of health reference indicator of the battery is obtained according to the OCV in the fully charged state of the battery.

In one embodiment, the storage unit further stores full charge capacity offset information (FCC Offset information). The battery capacity estimation method further includes a step of calculating, by the processing unit, a $Q_{Max}$ of the battery according to $Q_T$, wherein the $Q_{Max}$ represents a maximum inherent capacity. In this step, the processing unit calculates a first FCC Offset corresponding to the predetermined discharge C-rate and the temperature according to the FCC Offset information, and calculates the $Q_{Max}$ of the battery according to both of the $Q_T$ and the first FCC Offset.

In one embodiment, in the step of calculating, by the processing unit, the $Q_{Max}$ of the battery according to the $Q_T$, the processing unit calculates a second FCC Offset corresponding to the temperature and a discharge C-rate according to the FCC Offset information; and calculates an FCC according to the $Q_{Max}$ and the second FCC Offset, wherein the FCC is a battery capacity at the temperature and the discharge C-rate.

In one embodiment, the $Q_{Max}$ of the battery is calculated according to Equation 3:

Equation 3: $Q_{Max}=Q_T+FCC\ Offset_{PC,\ T}$, wherein PC represents the predetermined discharge C-rate, and FCC Offset$_{PC,\ T}$ represents the first FCC Offset.

In one embodiment, the FCC is calculated according to Equation 4:

Equation 4: $FCC_{C\text{-}Rate,\ T}=Q_{Max}-FCC\ Offset_{C\text{-}Rate,\ T}$, wherein $FCC_{C\text{-}Rate,\ T}$ represents the FCC at the discharge C-rate and the temperature, and FCC Offset$_{C\text{-}Rate,\ T}$ represents the second FCC Offset.

In one embodiment, the rest state is a state that the current does not flow when charging or discharging.

In one embodiment, the FCC Offset information is an FCC Offset table or a function obtained from experiments according to multiple currents and multiple temperatures.

According to an embodiment of this disclosure, an electronic product including an electronic device and a battery module is provided. The battery module is connected to the electronic device, and includes a battery and a control system. The control system detects the battery using the above-mentioned battery capacity estimation method.

According to an embodiment of this disclosure, a battery module connected to an electronic device is provided. The battery module includes a battery and a control system. The control system includes a detection unit, a storage unit and a processing unit. The detection unit measures operation data of the battery. The storage unit stores OCV information, multiple design capacities and FCC Offset information. The OCV information includes an OCV table or a function at an arbitrary temperature. The processing unit calculates the operation data. The control system detects the battery according to the above-mentioned battery capacity estimation method.

In summary, an embodiment of this disclosure can measure an OCV of the battery, which is in a rest state after the battery has been continuously electrically connected to a power source for a predetermined period, and calculates the FCC of the battery according to the OCV. Therefore, the FCC still can be updated even though the continuous discharge condition is not reached, and the FCC can be updated more frequently.

BRIEF DESCRIPTION OF THE SEVERAL VIEWS OF THE DRAWINGS

FIGS. 7A-7B are a flow chart showing a battery capacity estimation method according to an embodiment of this disclosure.

DETAILED DESCRIPTION OF THE INVENTION

Figure 1:
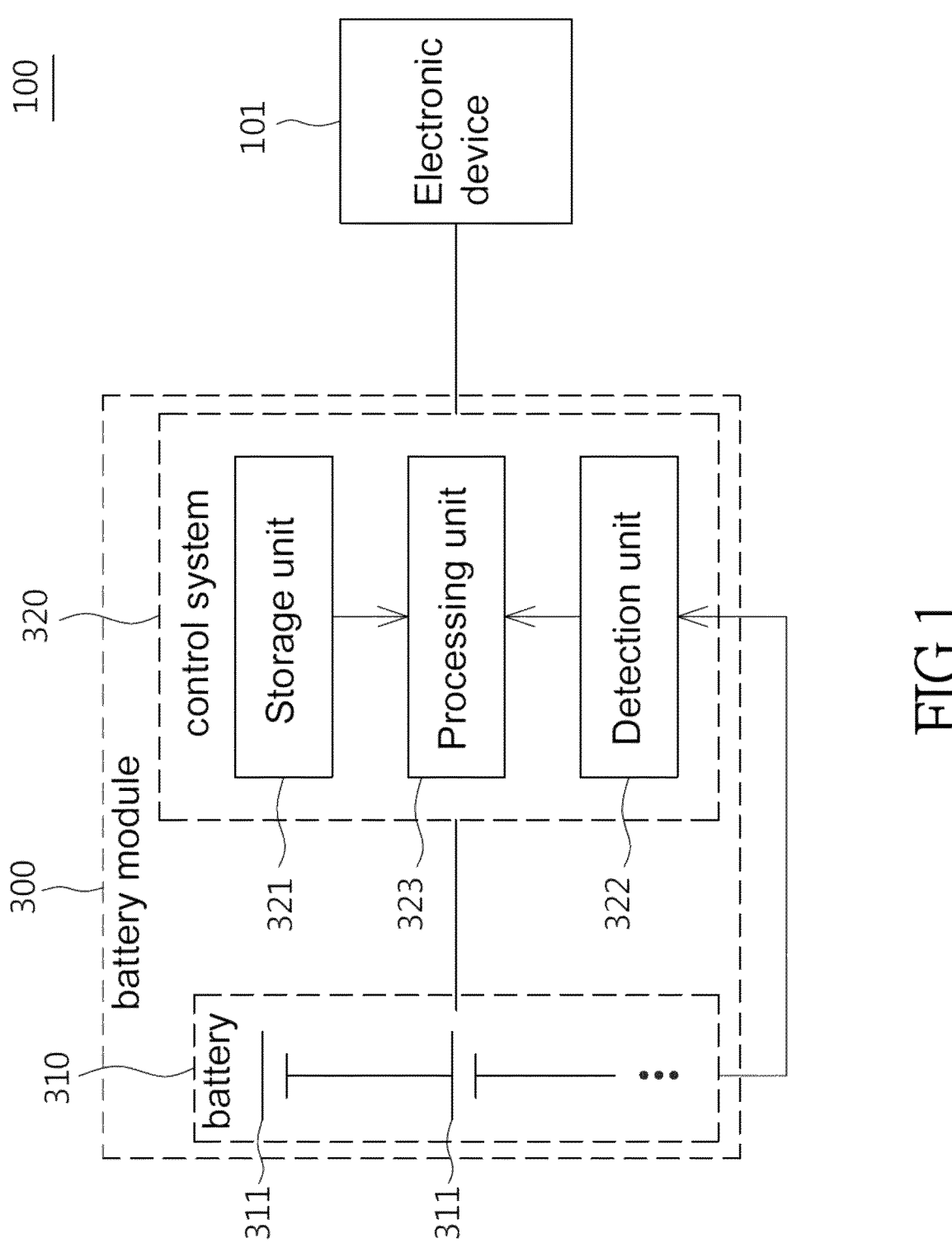
FIG. 1 is a functional block diagram showing an electronic product according to an embodiment of this disclosure.

FIG. 1 is a functional block diagram showing an electronic product 100 according to an embodiment of this disclosure. The electronic product 100 includes a battery module 300 and an electronic device 101. The battery capacity estimation method according to an embodiment of this disclosure can be applied to the battery module 300. Referring to FIG. 1, the battery module 300 connected to the electronic device 101 includes a battery 310 and a control system 320. The battery 310 includes one cell 311 or multiple cells 311 electrically connected together. The control system 320 can execute the battery capacity estimation method, and includes a storage unit 321, a detection unit 322 and a processing unit 323. The storage unit 321 may be, for example, a memory for storing operation data, such as operation data corresponding to a look-up table or function. The detection unit 322 is connected to the cell 311 of the battery 310 and obtains battery information of the cell 311, such as the temperature, voltage and the like. The processing unit 323 obtains, from the storage unit 321 and the detection unit 322, the data required by the battery capacity estimation method to estimate an inherent capacity $Q_T$ or an FCC of the battery 310. In addition, those skilled in the art can determine the structures of the battery 310 and the control system 320 according to this disclosure, the properties of circuit elements adopted for implementing this disclosure, and/or the effects to be achieved upon implementing this disclosure. In addition, those skilled in the art can implement this disclosure by equivalent modifications according to the disclosed contents. The battery capacity estimation method for the battery according to this disclosure will be explained more specifically. The electronic product 100 may be an electronic product, such as a notebook computer, a mobile phone, a camera and the like; or products of vehicle electronics.

When an end user is using the electronic product 100 (e.g., the 3C product and the like) including the electronic device 101 and the battery module 300 electrically connected together, the electronic product 100 is frequently electrically connected to a charger for charging the battery module 300. After the charger has charged the battery module 300 to the fully charged state, the battery module 300 is not charged any more. At this time, the entire discharge power consumption of the electronic product 100 is provided by the charger, but is not provided by the battery 310, and the battery 310 will enter a rest state without any charge current and any discharge current. Thus, the battery 310 in the rest state is continuously electrically connected to a power source for a predetermined period, and the battery 310 enters an open circuit state. According to the user's habit, it is found, by way of researching, that the end user will not immediately remove the charger after the battery 310 is fully charged. The inherent capacity $Q_T$ or the FCC of the battery 310 can be estimated according to the feature that the open circuit state of the battery 310 corresponds a SOC, so that the problems encountered in the prior art can be solved.

According to an embodiment of this disclosure, a more practical way is adopted in conjunction with the use habit of the end user of connecting to the charger for a long time without fully charging/discharging the battery 310, so that the inherent capacity $Q_T$ or the FCC of the lithium-ion battery 310 can be estimated when the battery 310 is fully charged at an arbitrary temperature. In one embodiment, the FCC can be frequently updated.

The SOC of the lithium-ion battery reflects the indicator of the remaining capacity at that time. The DOD is defined as a percentage of the capacity discharged from the fully charged state in the FCC. That is, the SOC of the battery plus the DOD of the battery equals 100%. So, the DOD is complementary to the SOC.

The lithium-ion battery has the feature that an OCV corresponds to the only value of the SOC at the same temperature. The lithium-ion battery has different open circuit voltage curves (OCV curves) at different temperatures. In practical applications, the open circuit voltage-state of charge curve (OCV-SOC curve) may be stored as a look-up table or a function in advance. The capacity, obtained when the new lithium-ion battery 310 is continuously discharged from the fully charged state at a predetermined discharge C-rate PC (e.g., 0.2 C) at an arbitrary temperature, is referred to as a design capacity (DC) at the arbitrary temperature. In one embodiment, C-rate is a measurement of the ratio between current and design capacity when a battery is charged or discharged. For example, there is a battery with a design capacity of 300 mAh, and the discharging current is 60 mA. The C-rate of the battery would be 60 mA/300 mAh=0.2 C, and the discharging time would be 300 mAh/60 mA=5 (hr).

The lithium-ion battery has different discharge capacities at different temperatures and different discharge currents owing to the lithium-ion battery feature. In one embodiment, multiple design capacities are stored in the storage unit 321 of the control system 320. Preferably, the design capacities are multiple battery capacities reflecting with different temperatures at a predetermined discharge C-rate.

Figure 2A:
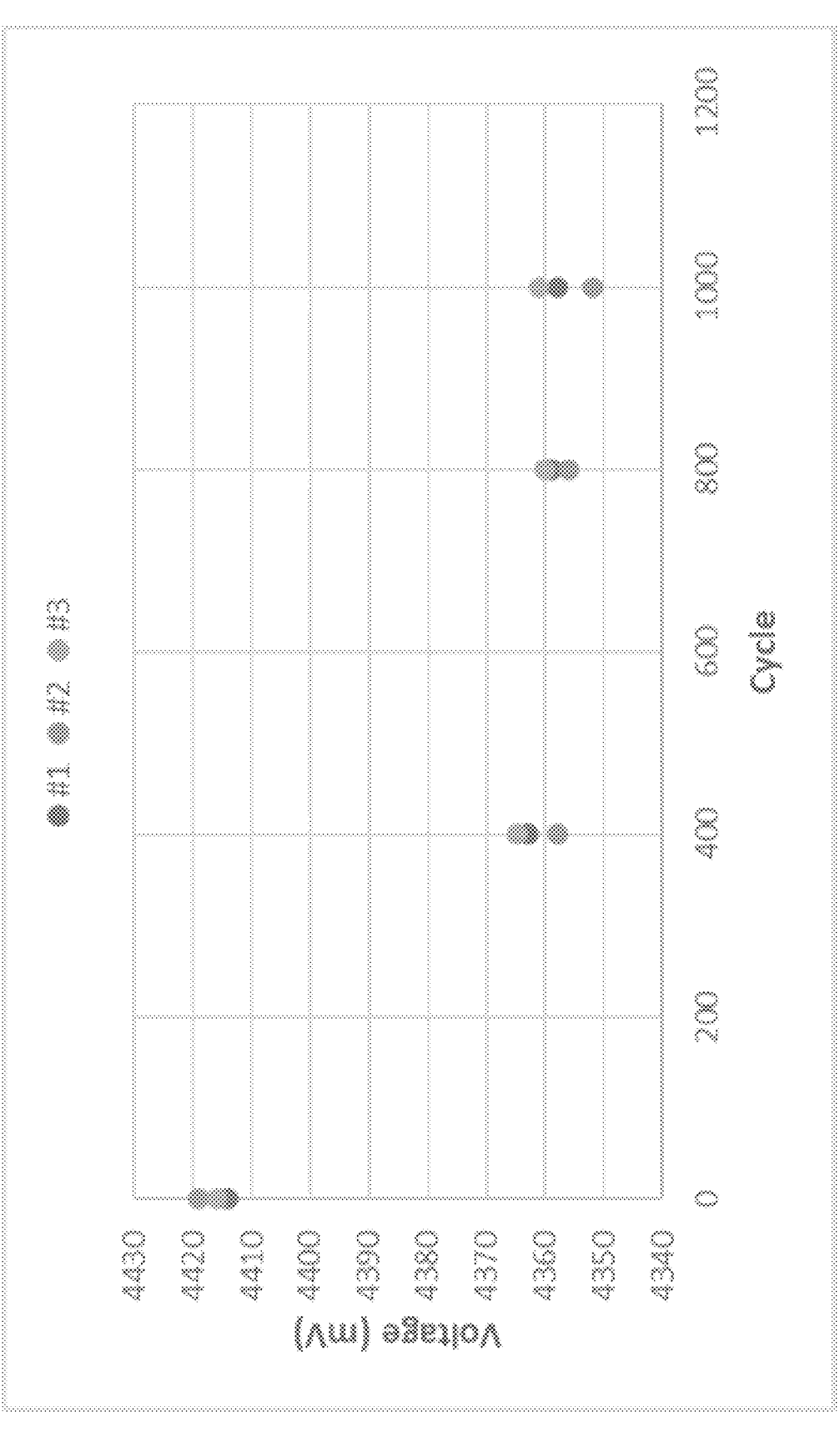
FIG. 2A shows a chart of a cycle count versus an OCV of a battery in fully charged state according to an embodiment of this disclosure.
Figure 2B:
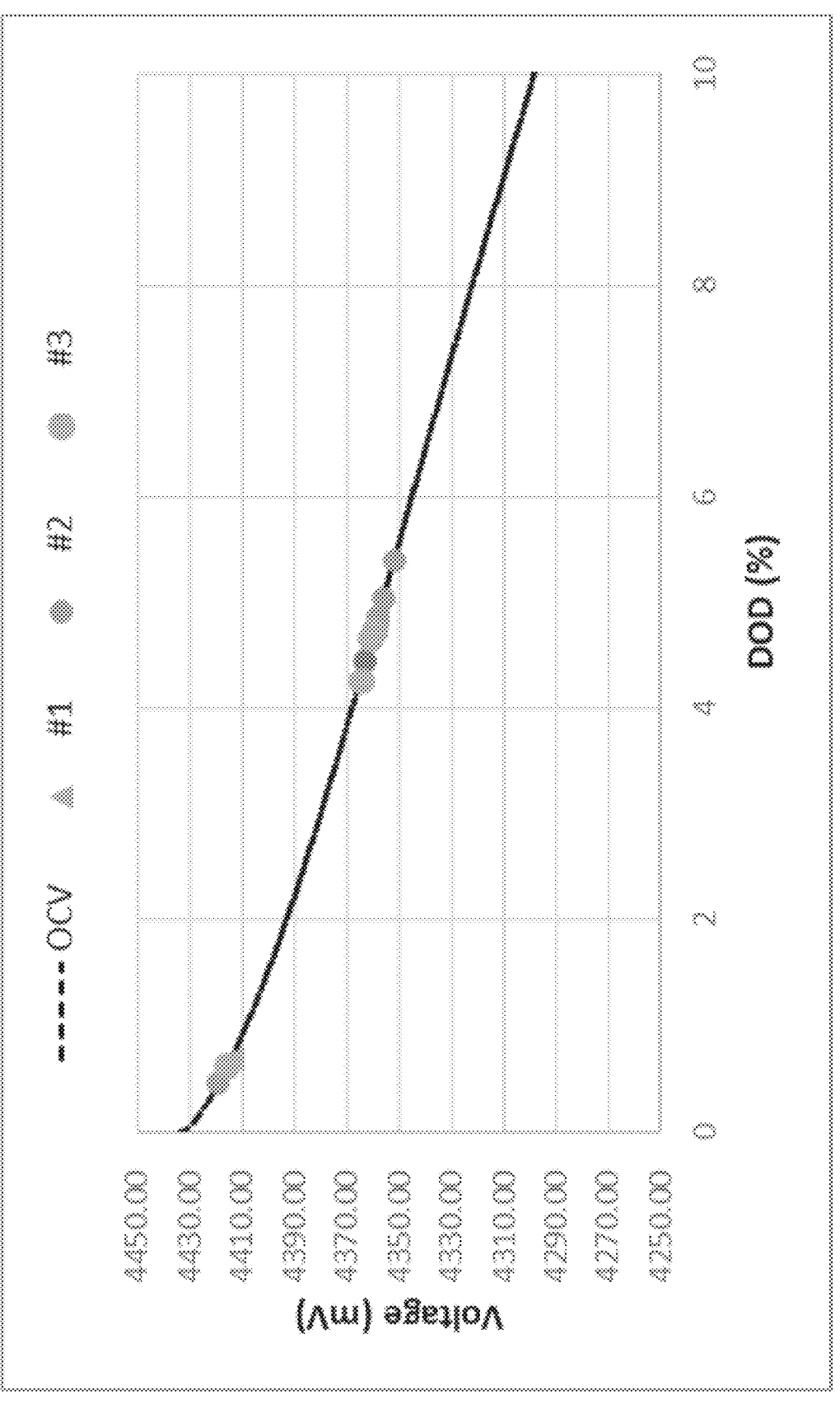
FIG. 2B is a graph showing a curve of a DOD of the battery versus the OCV in the fully charged state according to an embodiment of this disclosure.
Figure 3:
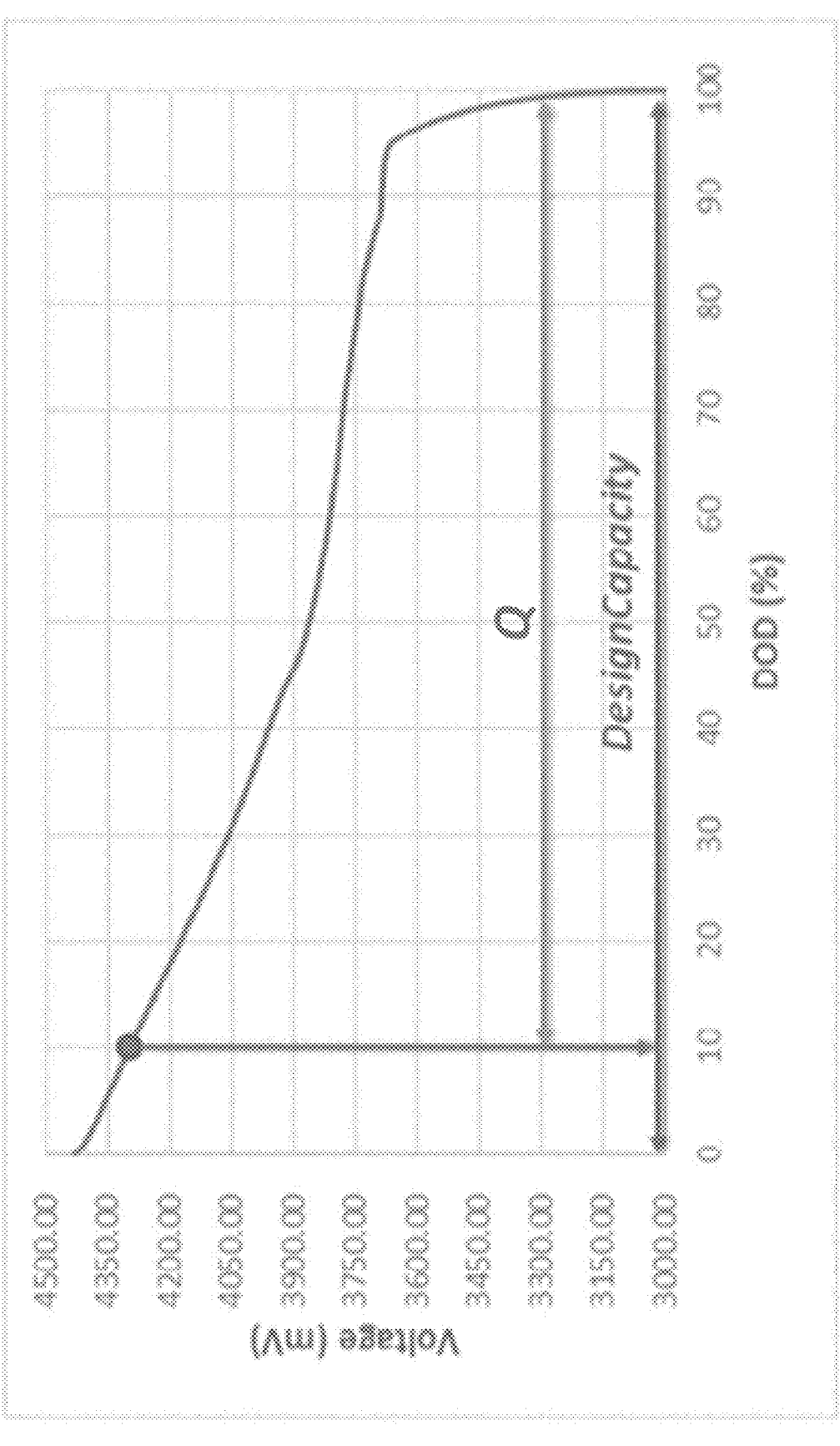
FIG. 3 is a schematic view showing a relationship between an inherent capacity and a design capacity according to an embodiment of this disclosure.

The internal resistance of the lithium-ion battery 310 is gradually increased with the increment of the cycle count of the battery. In other words, the battery 310 would have the lower OCV by the fully charged judgement applied in this such circumstance. The value of the OCV is gradually decreased along the curve of the OCV, as shown in FIGS. 2A and 2B. So, the SOC of the cell 311 can be obtained based on this feature of the OCV in the fully charged state. FIG. 3 is a schematic view showing a relationship between the inherent capacity and the design capacity according to an embodiment of this disclosure. Then, as shown in FIG. 3, the inherent capacity of the battery 310 can be estimated according to the SOC and the design capacity. It can also be obtained that the internal resistance value is gradually increased with the increase of the cycle count, and the OCV is gradually decreased therewith. That is, the OCV in the fully charged state of the battery 310 is gradually decreased with the gradual increase of the cycle count of the battery 310. In other words, such the concept may also be regarded as a state of health (SOH) of the battery, and thus the OCV in the fully charged state may serve as a reference indicator of the SOH of the battery in one embodiment. In one embodiment, because a relationship between the OCV in the fully charged state and the reference indicator of the SOH of the battery is presented, the reference indicator of the SOH of the battery may be a function of the OCV in the fully charged state. As mentioned hereinabove, the reference indicator of the SOH of the battery 310 can be obtained according to the OCV in the fully charged state of the battery 310 in one embodiment of this disclosure.

The FCC is defined as the capacity of the battery 310 that can be continuously discharged from the fully charged state at an arbitrary current and an arbitrary temperature. In one embodiment, the internal mechanisms of the control system 320 of the battery module 300 operate according to the FCC. For example, the SOC is calculated according to the FCC, so the accuracy of the FCC is an important key for determining the accuracy of the SOC.

Figure 4:
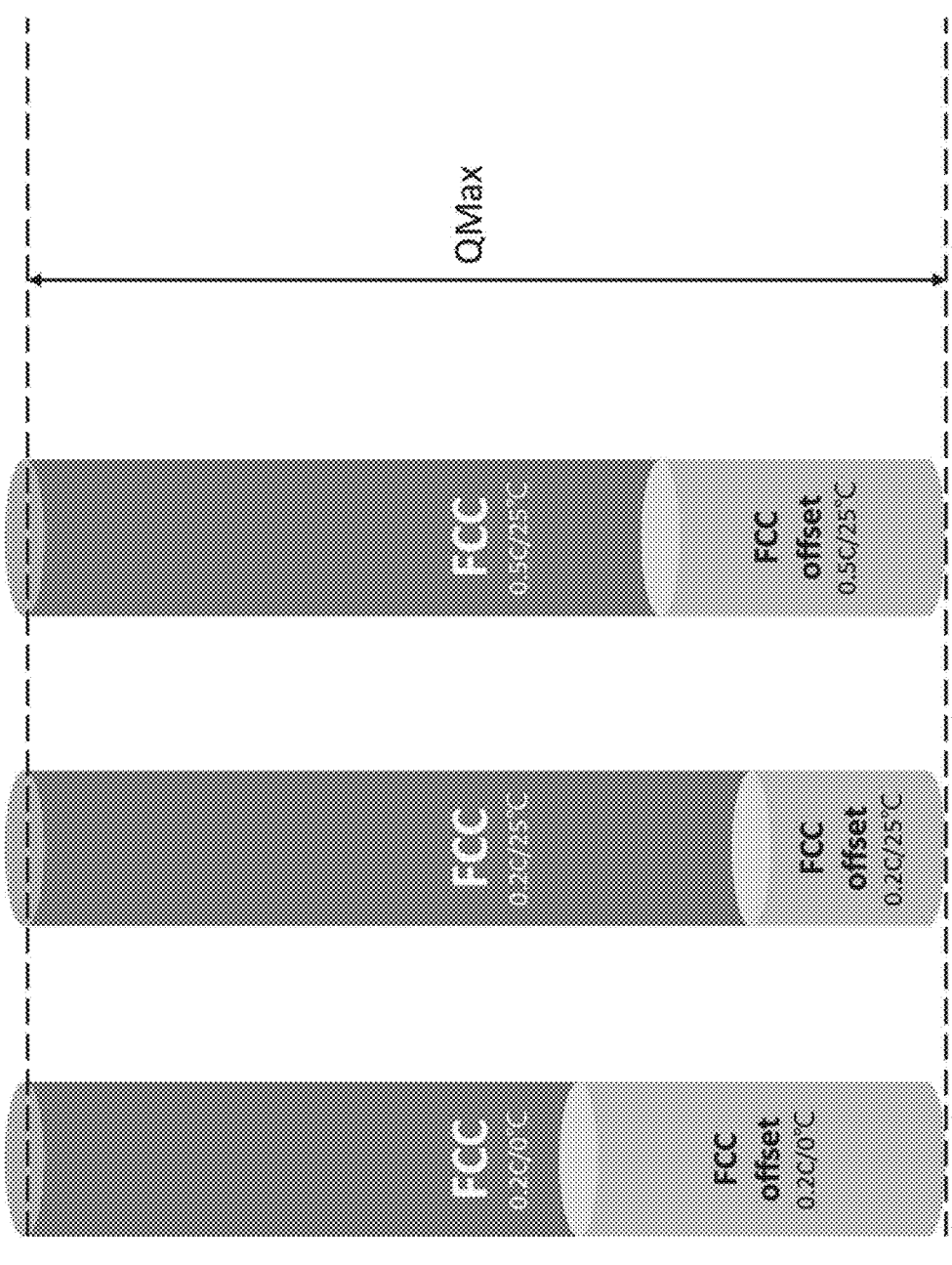
FIG. 4 is a schematic view showing a maximum inherent capacity $Q_{Max}$, multiple full charge capacities and an FCC Offset table according to an embodiment of this disclosure.

FIG. 4 is a schematic view showing $Q_{Max}$, multiple full charge capacities and an FCC Offset table according to an embodiment of this disclosure. Referring to FIG. 4, in order to accurately estimate and update the FCC in the fully charged state at different currents and temperatures, a new variable, a maximum inherent capacity $Q_{Max}$ defined as a maximum capacity of the battery 310 that can be discharged, is introduced in one embodiment of this disclosure. In other words, the $Q_{Max}$ of the battery 310 will not vary from different currents or different temperatures. That is, the FCC varies from different currents or different temperatures, but the maximum inherent capacity $Q_{Max}$ does not. Hypothetically, if an offset exists between the maximum inherent capacity $Q_{Max}$ and the FCC, and the offset varies from the current and the temperature, then the offset is named as an FCC Offset. Thus, the FCC can be calculated according to the maximum inherent capacity $Q_{Max}$, and the FCC can be calculated according to Equation (4):

$$FCC_{C\text{-}Rate,\ T} = Q_{Max} - FCC\ Offset_{C\text{-}Rate,\ T} \qquad \text{Equation (4)},$$

wherein C-Rate represents a discharge C-rate, T represents the temperature, and "C-Rate, T" represents the condition at the discharge C-rate and the temperature. FIG. 4 exemplarily shows the relationships between the FCC Offsets and the full charge capacities at the discharge C-rate of 0.2 C and at the temperature of 0° C., at the discharge C-rate of 0.2 C and at the temperature of 25° C.; and at the discharge C-rate of 0.5 C and at the temperature of 25° C., respectively.

Figure 5:
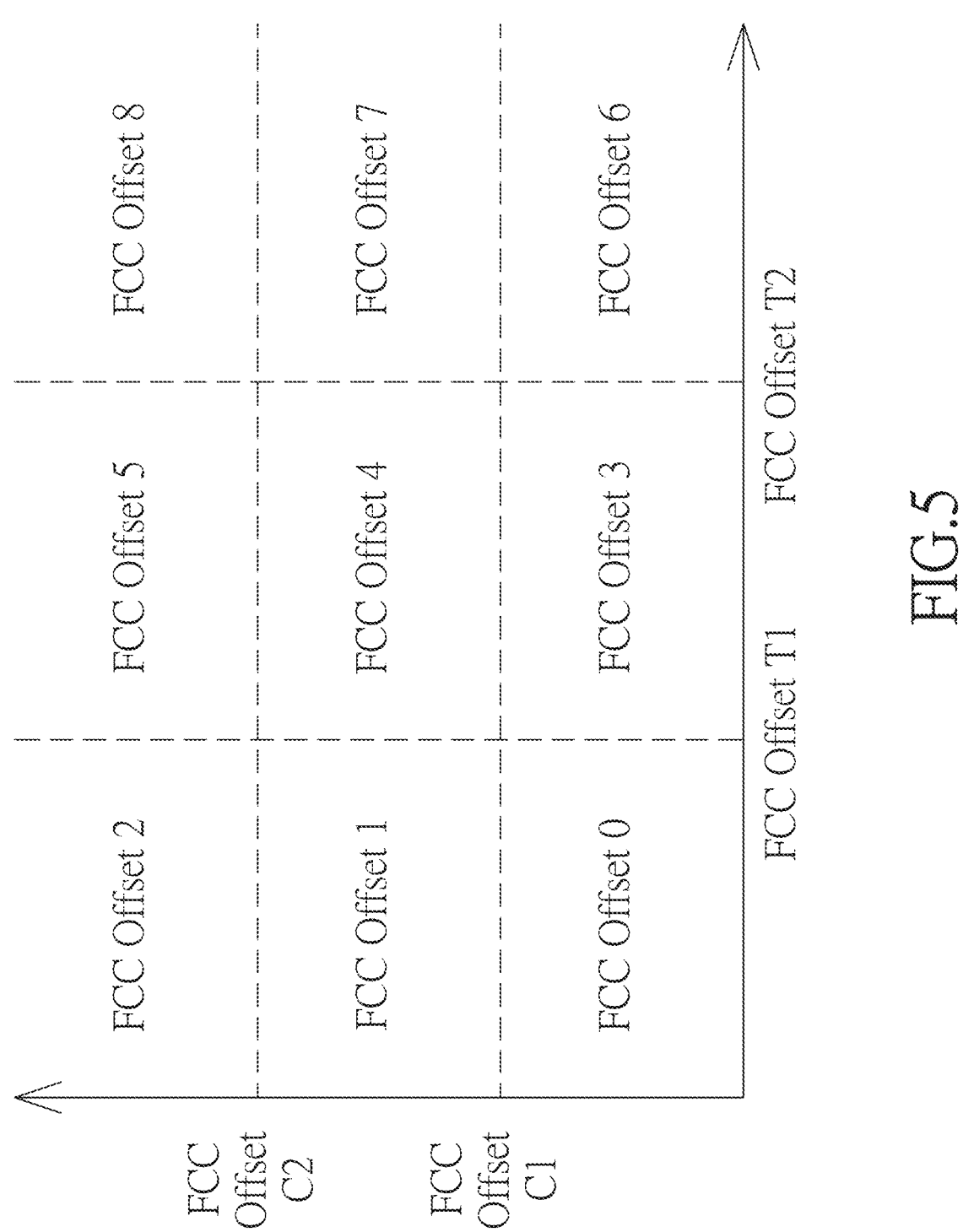
FIG. 5 is a schematic view showing an FCC Offset table according to an embodiment of this disclosure.

FIG. 5 shows an example of the FCC Offset table, wherein two currents (C1 and C2) play the roles as boundaries on the vertical axis, and two temperatures (T1 and T2) function as boundaries on the horizontal axis, and each of the axes is divided into three zones. For example, FCC Offset 0 represents the zone in which the temperature is lower than FCC Offset T1 and the current is lower than FCC Offset C1, and FCC Offset 8 represents the zone in which the temperature is higher than FCC Offset T2 and the current is higher than FCC Offset C2. In practical, the FCC Offsets need to be stored in the storage unit 321 of the control system 320 by way of a look-up table in advance. In this embodiment, the FCC Offset information is an FCC Offset table functioning as an example to be explained. In other embodiment, however, the data corresponding to FIG. 5 may also be converted or transformed into a function as the FCC Offset information stored in the storage unit 321.

In one embodiment, the FCC Offset table or the function mentioned hereinabove may also be linked with the relationship of the maximum inherent capacity $Q_{Max}$ and the FCC. That is, when the FCC at the arbitrary current and the arbitrary temperature range needs to be calculated, the FCC Offset table or the function converted from the data may be adopted to calculate the FCC Offset at the arbitrary temperature and the arbitrary discharge C-rate, and enabling to update the FCC at the arbitrary current and the temperature range.

The maximum inherent capacity $Q_{Max}$ and the FCC Offset pertain to the battery dependent parameter. That is, different types of batteries 310 respectively have different parameters, so the parameters can be obtained from experiments. In the example of the FCC Offset table of FIG. 5, the battery 310 has nine conditions in total in the three current zones and the three temperature zones, and is continuously discharged from the fully charged state to the cut-off voltage, so that the actual discharge capacity of the battery 310 in each zone can be obtained. There are totally nine actual discharge capacities that can be obtained, and a maximum of the discharge capacities is taken and multiplied by a preset ration to obtain an initial maximum inherent capacity $Q_{Max}$. Finally, each of the nine discharge capacities are subtracted from the maximum inherent capacity $Q_{Max}$ so that the nine FCC Offsets of FIG. 5 are obtained.

Embodiment

Figure 7A:
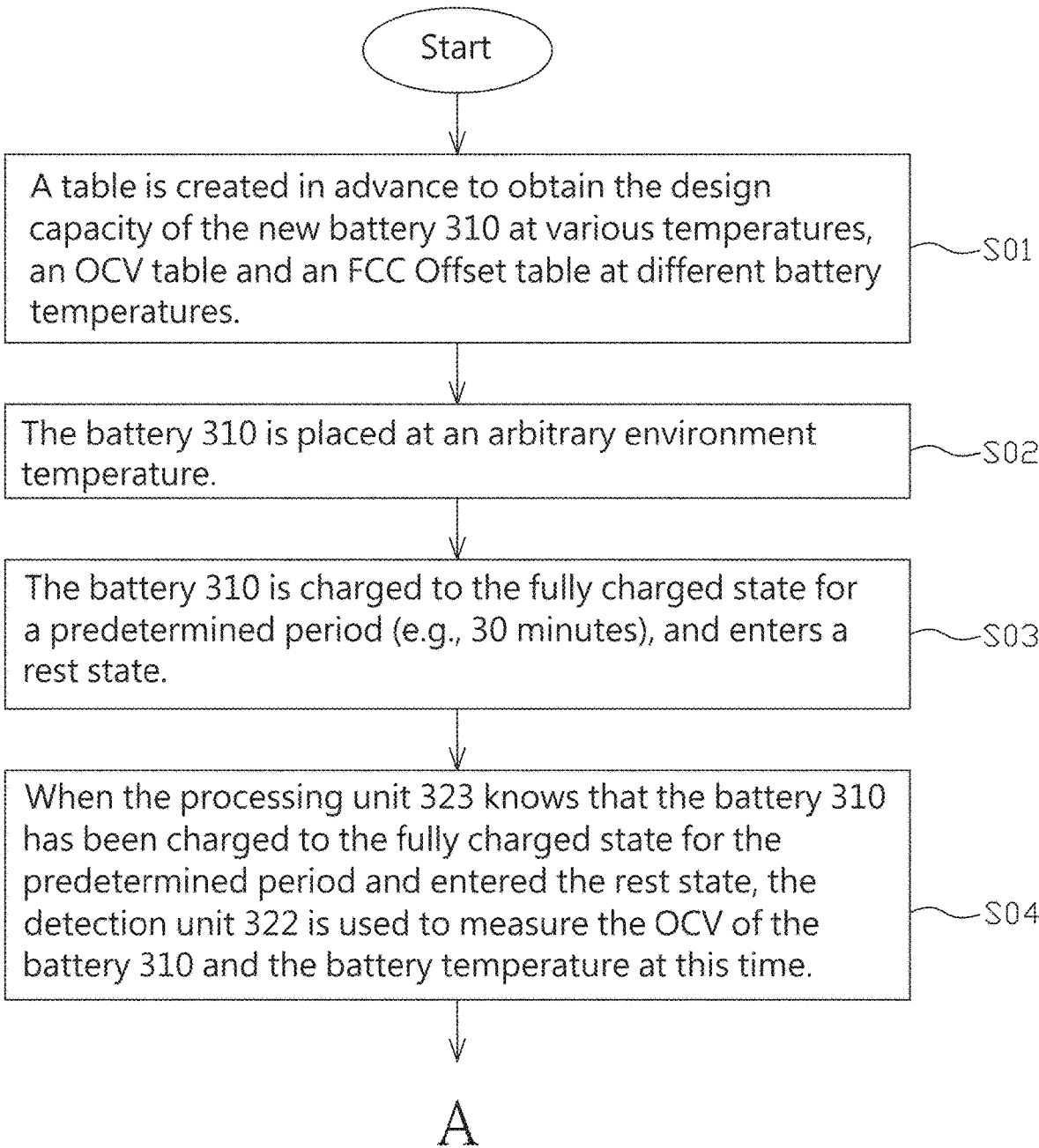

FIGS. 7A-7B are a flow chart showing a battery capacity estimation method according to an embodiment of this disclosure. Referring to FIGS. 7A-7B, the specific implementation method for the battery 310 at the arbitrary environment temperature includes steps S01 to S08.

In the step S01, a table is created in advance to obtain the design capacity of the new battery 310 at various temperatures, an OCV table and an FCC Offset table at different battery temperatures.

In the step S02, the battery 310 is placed at an arbitrary environment temperature.

In the step S03, the battery 310 is charged to the fully charged state for a predetermined period (e.g., 30 minutes), and enters a rest state.

In the step S04, when the processing unit 323 knows that the battery 310 has been charged to the fully charged state for the predetermined period and entered the rest state, the detection unit 322 is used to measure the OCV of the battery 310 and the battery temperature at this time.

In the step S05, the corresponding SOC of the battery 310 at this time is obtained according to the measured OCV by looking up the OCV table corresponding to the battery temperature.

In the step S06, the inherent capacity $Q_T$ of the battery 310 at the arbitrary temperature and at the discharge C-rate of 0.2 C is estimated according to Equation (1).

$$Q_T = \text{Design Capacity}_T \times \text{SOC \%}, \qquad \text{Equation (1)}:$$

wherein T represents the temperature, $Q_T$ represents the inherent capacity at the temperature, Design Capacity$_T$ represents the design capacity corresponding to the temperature and the predetermined discharge C-rate, and SOC represents the SOC.

In one embodiment, the step S06 may also estimate the inherent capacity $Q_T$ of the battery 310 at the arbitrary temperature and at the discharge C-rate of 0.2 C according to Equation (2), $$Q_T = \text{Design Capacity}_T \times (1 - \text{DOD \%}), \qquad \text{Equation (2)}:$$

wherein T represents the battery temperature, $Q_T$ represents the inherent capacity at the temperature, Design Capacity$_T$ represents the design capacity corresponding to the battery temperature and the predetermined discharge C-rate, and DOD represents the depth of discharge, wherein the SOC plus the DOD equals 100%.

In the step S07, the maximum inherent capacity $Q_{Max}$ is estimated according to the 0.2 C inherent capacity and the first FCC Offset of the battery 310 at an arbitrary temperature and according to Equation (3).

$$Q_{Max} = Q_T + \text{FCC Offset}_{PC,T}, \qquad \text{Equation (3)}:$$

wherein $Q_{Max}$ represents the maximum inherent capacity, PC represents the predetermined discharge C-rate, and FCC Offset$_{PC, T}$ represents the first FCC Offset, wherein the first FCC Offset relates to the predetermined discharge C-rate and the arbitrary temperature.

In the step S08, the discharge capacity (i.e., the full charge capacity FCC) of the battery 310 at the arbitrary current and temperature can be estimated according to the maximum inherent capacity $Q_{Max}$ and the second FCC Offset according to Equation (4).

$$\text{FCC}_{C\text{-}Rate, T} = Q_{Max} - \text{FCC Offset}_{C\text{-}Rate, T}, \qquad \text{Equation (4)}:$$

wherein FCC$_{C\text{-}Rate, T}$ represents the FCC at the discharge C-rate and the temperature, and FCC Offset$_{C\text{-}Rate, T}$ represents the second FCC Offset, wherein the second FCC Offset relates to the discharge C-rate and the temperature.

In the above-mentioned embodiment, each equation is described according to the example, in which the predetermined discharge C-rate equals 0.2 C and the predetermined temperature equals 25° C. In other embodiments, however, other values may be configured in response to various product and environment requirements.

The experimental verification results of the battery module 300 at different temperatures and loads will be described in the following by the following testing steps.

(a) The batteries 310 are respectively placed at the environment temperatures of 0° C., 25° C. and 40° C.

(b) The batteries 310 are charged to the fully charged states.

(c) An estimated FCC is obtained after a 30 minutes rest.

(d) The batteries 310 are respectively discharged to 3V with the loads equal to 10%, 50% and 100% of the continuous maximum discharge powers of the batteries 310 at the three different temperatures to obtain the actual full charge capacities of the batteries 310, and thus to obtain nine experimental results.

Figure 6A:
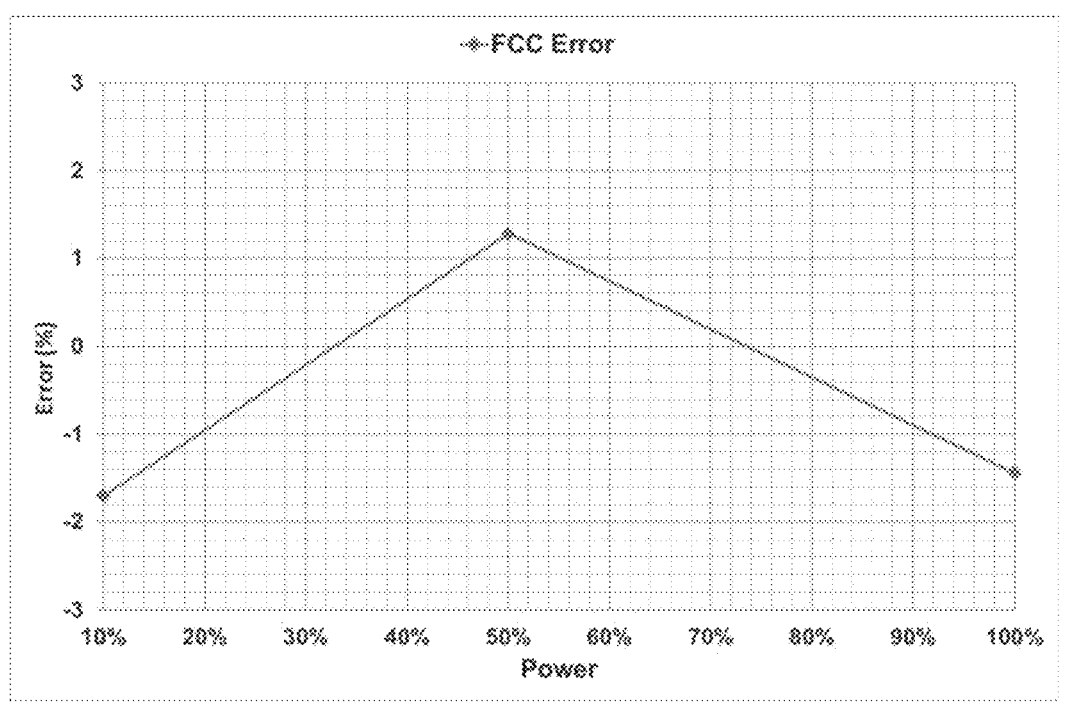
FIG. 6A is a chart showing comparisons of accurate values of the estimated full charge capacities and the actual full charge capacities of a battery module under different loads at 0° C.
Figure 6B:
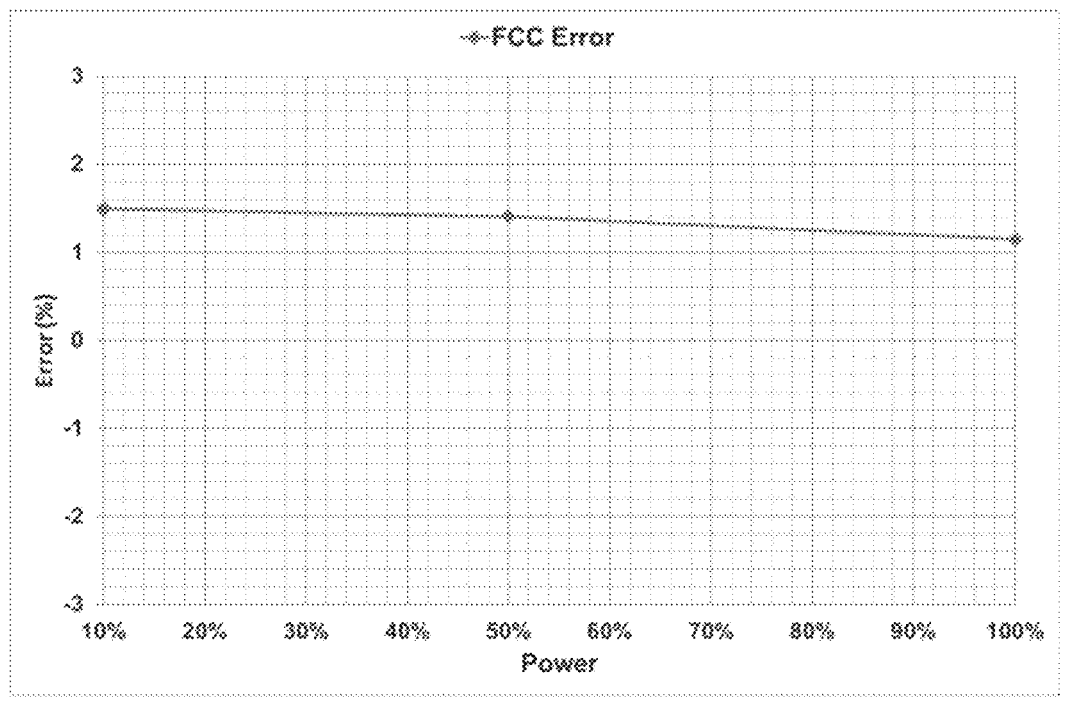
FIG. 6B is a chart showing comparisons of accurate values of the estimated full charge capacities and the actual full charge capacities of the battery module under different loads at 25° C.
Figure 6C:
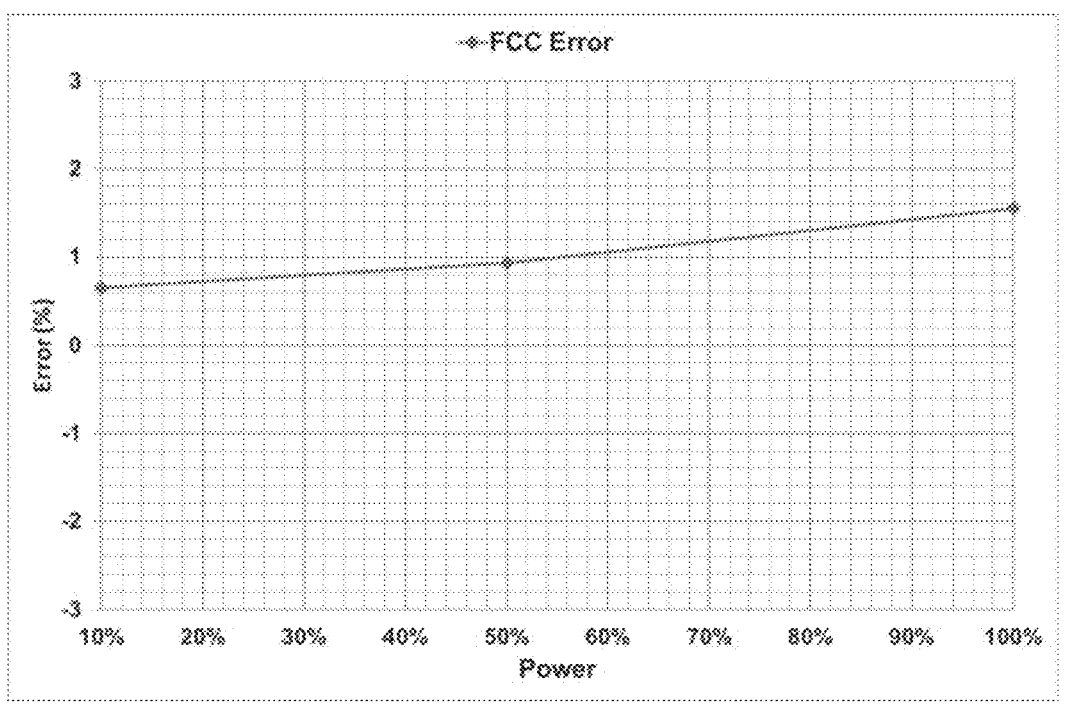
FIG. 6C is a chart showing comparisons of accurate values of the estimated full charge capacities and the actual full charge capacities of the battery module under different loads at 40° C.

FIGS. 6A, 6B and 6C are charts showing comparisons of accurate values of the estimated full charge capacities and the actual full charge capacities, wherein the horizontal axis denotes the discharge power and the vertical axis denotes the error. As shown in FIGS. 6A, 6B and 6C, the discharge capacities of the battery module 300 at different temperatures and loads can be estimated with a certain degree of accuracy using the battery capacity estimation method of this disclosure, and the amplitude of error can be controlled within 3%.

The cyclic aging verification results of the battery module 300 at different temperatures will be described in the following by the following testing steps.

(a) The batteries 310 are respectively placed at the environment temperatures 25° C. and 40° C.

(b) The batteries 310 are charged to the fully charged states.

(c) An estimated FCC is obtained after a 20 minutes rest.

(d) The batteries 310 are respectively discharged to 3V with the loads equal to 50% of the continuous maximum discharge powers of the batteries 310 to obtain the actual battery capacities of the batteries 310.

(e) Take a rest for 20 minutes.

(f) The above-mentioned steps are repeated.

Figure 6D:
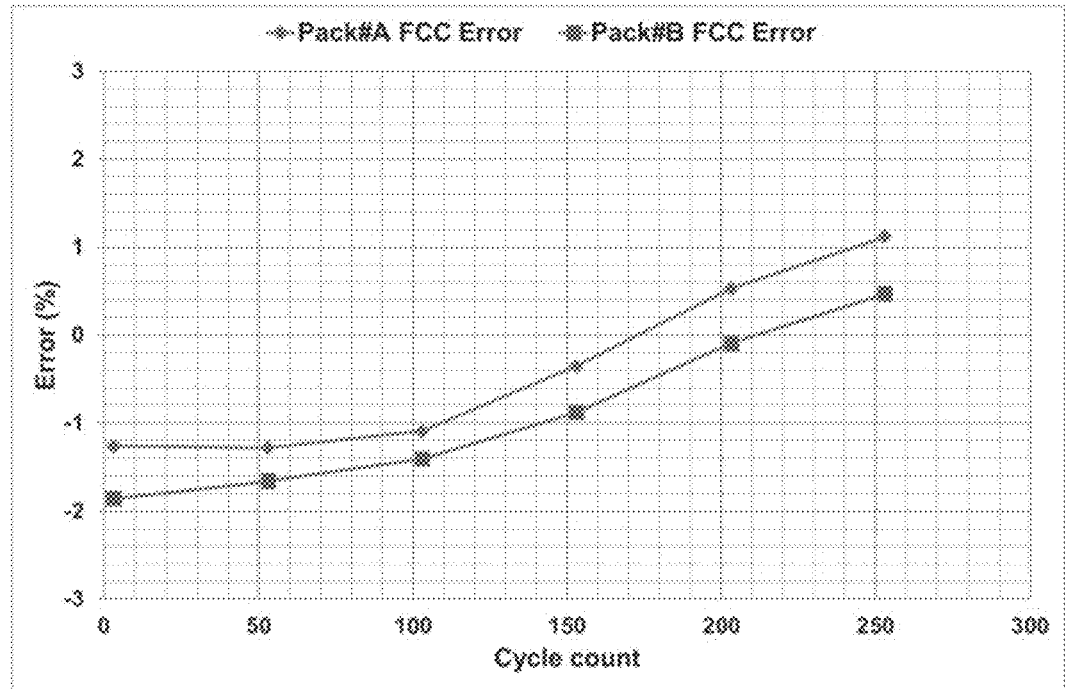
FIG. 6D is a chart showing comparisons of accurate values of the estimated full charge capacities and the actual full charge capacities of the battery module under the cyclic aging test at 25° C.
Figure 6E:
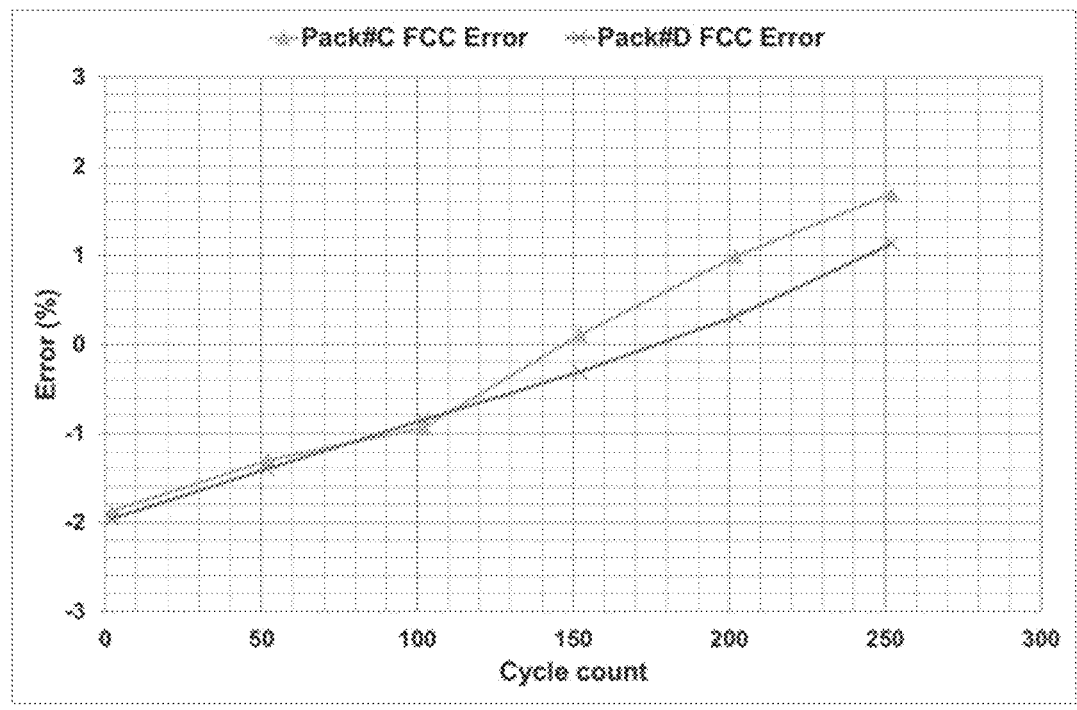
FIG. 6E is a chart showing comparisons of accurate values of the estimated full charge capacities and the actual full charge capacities of the battery module under the cyclic aging test at 45° C.

The battery modules Pack #A, Pack #B, Pack #C and Pack #D have the same conditions. FIG. 6D shows the experimental results of the battery modules Pack #A and Pack #B at 25° C., and FIG. 6E shows the experimental results of the battery modules Pack #C and Pack #D at 40° C. FIGS. 6D and 6E are charts showing comparisons of accurate values of the estimated full charge capacities and the actual full charge capacities, wherein the horizontal axis denotes the cycle count and the vertical axis denotes the error. According to FIGS. 6D and 6E, it is obtained that the cyclic aging battery discharge capacities at different temperatures can be detected using the battery capacity estimation method of this disclosure, and the calculated exact margin of error can be controlled within 3%.

In summary, the embodiment of this disclosure can provide a battery capacity estimation method, wherein the FCC still can be updated even if the continuous discharge condition is not reached, and the FCC of the lithium-ion battery 310 can be estimated according to the use habit of the end user of connecting to the charger for a long time without fully charging/discharging the battery 310, so that the FCC can be frequently updated. Because the value of the OCV in the fully charged state implies the concept of the SOH of the battery, this method is also effective to the FCC estimation of the aging battery. In one embodiment, the inherent capacity $Q_T$ or the FCC may also be estimated at the same time, and the FCC is provided for the electronic device 101 that can perform calculations of actual electrical related programs. In one embodiment, the FCC of the lithium-ion battery 310 may also be estimated when the battery 310 is fully charged at an arbitrary temperature.

What is claimed is:

1. A battery capacity estimation method being applied to a battery module comprising a battery and a control system and detecting a battery level of the battery of the battery module, wherein:

the control system comprises a detection device connected to the battery, a storage and a processor;

the detection device comprises a voltage measurement sensor and a temperature measurement sensor;

the storage stores open circuit voltage (OCV) information and multiple design capacities, and the OCV information comprises an OCV table or a function corresponding to different temperatures, and the multiple design capacities are multiple battery capacities corresponding to different temperatures at a predetermined discharge C-rate; and the battery capacity estimation method comprises:

charging the battery to a fully charged state for a predetermined period until the battery has entered a rest state without any charge current and any discharge current;

measuring, by the voltage measurement device, an OCV and measuring, by the temperature measurement device, a temperature of the battery when the processor detects that the battery has entered the rest state;

obtaining, by the processor, a state of charge (SOC) of the battery according to the OCV, by using the OCV table or the function corresponding to the temperature of the battery;

obtaining a design capacity corresponding to the temperature at the predetermined discharge C-rate, according to the multiple design capacities; and calculating, by the processor, a $Q_T$ of the battery according to the design capacity corresponding to the temperature and the SOC, wherein the $Q_T$ represents an inherent capacity at the temperature.

2. The battery capacity estimation method according to claim 1, wherein:

the multiple design capacities are multiple battery capacities corresponding to different temperatures at a predetermined discharge C-rate; and the $Q_T$ is a battery capacity at the temperature and the predetermined discharge C-rate.

3. The battery capacity estimation method according to claim 1, wherein the $Q_T$ is calculated according to Equation 1:

$$Q_T = \text{Design Capacity}_T \times \text{SOC \%}, \qquad \text{Equation 1:}$$

wherein T represents the temperature, Design Capacity$_T$ represents the design capacity corresponding to the temperature and the predetermined discharge C-rate, and SOC represents the state of charge.

4. The battery capacity estimation method according to claim 3, wherein:

the storage further stores full charge capacity (FCC) Offset information; and the battery capacity estimation method further comprises a step of calculating a first FCC Offset corresponding to the predetermined discharge C-rate and the temperature according to the FCC Offset information and a step of calculating a $Q_{Max}$ of the battery according to the $Q_T$ and the first FCC Offset, by using the processor, wherein the $Q_{Max}$ represents a maximum inherent capacity.

5. The battery capacity estimation method according to claim 4, wherein in the step of calculating, by the processor, the $Q_{Max}$ of the battery according to the $Q_T$, the processor calculates a second FCC Offset corresponding to the temperature and the predetermined discharge C-rate according to the FCC Offset information; and calculates a full charge capacity according to the $Q_{Max}$ and the second FCC Offset, wherein the full charge capacity is a battery capacity at the temperature and the predetermined discharge C-rate.

6. The battery capacity estimation method according to claim 5, wherein the FCC is calculated according to Equation 4:

$$\text{FCC}_{C\text{-}Rate,\ T} = Q_{Max} - \text{FCC Offset}_{C\text{-}Rate,\ T}, \qquad \text{Equation 4:}$$

wherein $\text{FCC}_{C\text{-}Rate,\ T}$ represents the full charge capacity at the predetermined discharge C-rate and the temperature, and $\text{FCC Offset}_{C\text{-}Rate,\ T}$ represents the second FCC Offset.

7. The battery capacity estimation method according to claim 4, wherein the $Q_{Max}$ of the battery is calculated according to Equation 3:

$$Q_{Max} = Q_T + \text{FCC Offset}_{PC,\ T}, \qquad \text{Equation 3:}$$

wherein PC represents the predetermined discharge C-rate, and $\text{FCC Offset}_{PC,\ T}$ represents the first FCC Offset.

8. The battery capacity estimation method according to claim 4, wherein the FCC Offset information is an FCC Offset table or a function obtained from experiments according to multiple currents and multiple temperatures.

9. The battery capacity estimation method according to claim 1, wherein:

the SOC plus a DOD equals 100%; and the $Q_T$ is calculated according to Equation 2:

$$Q_T = \text{Design Capacity}_T \times (1 - \text{DOD \%}), \qquad \text{Equation 2:}$$

wherein T represents the temperature, Design Capacity represents the design capacity corresponding to the temperature and the predetermined discharge C-rate, and depth of discharge (DOD) represents the depth of discharge.

10. The battery capacity estimation method according to claim 1, wherein a state of health reference indicator of the battery is obtained according to the OCV in the fully charged state of the battery.

11. An electronic product, comprising:

an electronic device; and the battery module being connected to the electronic device, wherein the control system detects the battery level of the battery using the battery capacity estimation method according to claim 1.

12. The battery module being connected to an electronic device, wherein the control system detects a battery level of the battery using the battery capacity estimation method according to claim 1.

\* \* \* \* \*